(12) United States Patent
Kim et al.

(10) Patent No.: US 10,966,341 B2
(45) Date of Patent: Mar. 30, 2021

(54) LIGHTWEIGHT AND LOW-COST EMP PROTECTION RACK

(71) Applicant: ELECTRONICS AND TELECOMMUNICATIONS RESEARCH INSTITUTE, Daejeon (KR)

(72) Inventors: Kibaek Kim, Daejeon (KR); Daeheon Lee, Daejeon (KR); Minseok Yoon, Daejeon (KR); Seungkab Ryu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/794,398

(22) Filed: Feb. 19, 2020

(65) Prior Publication Data
US 2020/0383229 A1    Dec. 3, 2020

(30) Foreign Application Priority Data
May 28, 2019    (KR) .................. 10-2019-0062558

(51) Int. Cl.
H05K 7/14        (2006.01)
H05K 7/20        (2006.01)

(52) U.S. Cl.
CPC ....... H05K 7/1491 (2013.01); H05K 7/20736 (2013.01)

(58) Field of Classification Search
CPC combination set(s) only.
See application file for complete search history.

(56) References Cited

U.S. PATENT DOCUMENTS

| 8,289,717 | B2* | 10/2012 | Heimann | ................. H04Q 1/03 361/748 |
| 8,867,234 | B2* | 10/2014 | Heimann | ............... H04Q 1/025 361/818 |
| 8,987,610 | B2* | 3/2015 | Kim | ..................... H05K 9/0041 174/383 |
| 9,095,045 | B2* | 7/2015 | Rojo | ..................... H04Q 1/025 |

(Continued)

FOREIGN PATENT DOCUMENTS

| JP | 11-068374 A | 3/1999 |
| JP | 11-191689 A | 7/1999 |
| JP | 2000-238643 A | 9/2000 |

(Continued)

*Primary Examiner* — Lisa Lea-Edmonds
(74) *Attorney, Agent, or Firm* — LRK Patent Law Firm

(57) ABSTRACT

A lightweight and low-cost electromagnetic pulse (EMP) protection rack includes a front door, a rear door disposed to face the front door, a left outer wall disposed between the front door and the rear door, a right outer wall disposed to face the left outer wall, a top outer wall positioned on top parts of the front door, the rear door, the left outer wall, and the right outer wall, a bottom outer wall disposed to face the top outer wall, and a main frame disposed to connect, into a single unit, the front door, the rear door, the left outer wall, the right outer wall, the top outer wall and the bottom outer wall, wherein at least one of the front door and the rear door is implemented as a roller blind having a shielding member.

20 Claims, 7 Drawing Sheets

(56) References Cited

U.S. PATENT DOCUMENTS

2010/0206627 A1* 8/2010 Benner ................ H05K 9/0018
174/377
2015/0068026 A1* 3/2015 Rojo ...................... H04Q 1/025
29/593

FOREIGN PATENT DOCUMENTS

| | | |
|---|---|---|
| JP | 2002-089157 A | 3/2002 |
| KR | 10-0990828 B1 | 10/2010 |
| KR | 10-2012-0069053 A | 6/2012 |
| KR | 10-1319488 B1 | 10/2013 |
| KR | 10-1468874 B1 | 12/2014 |
| KR | 10-2015-0007389 A | 1/2015 |
| KR | 10-2015-0010514 A | 1/2015 |
| KR | 10-1547869 B1 | 8/2015 |
| KR | 10-2016-0014085 A | 2/2016 |
| KR | 10-1617669 B1 | 5/2016 |
| KR | 10-2017-0003161 A | 1/2017 |
| KR | 10-2017-0066031 A | 6/2017 |
| KR | 10-1970432 B1 | 4/2019 |

\* cited by examiner

LIGHTWEIGHT AND LOW-COST EMP PROTECTION RACK

CROSS REFERENCE TO RELATED APPLICATION

This application claims the benefit of Korean Patent Application No. 10-2019-0062558, filed May 28, 2019, which is hereby incorporated by reference in its entirety into this application.

BACKGROUND OF THE INVENTION

1. Technical Field

The present invention relates generally to a lightweight and low-cost electromagnetic pulse (EMP) protection rack.

2. Description of Related Art

Generally, while localization of an EMP protection rack that meets military specifications is performed, commercialization thereof is actively underway. It is expected that a certain degree of demand will be generated in financial institutions, information communication infrastructures, or the like. However, a commercial EMP protection rack is expensive, and thus it is financially burdensome to extensively apply the same to a site like a computer center in which typical racks are extensively used. The main shielding performance of an EMP protection rack that has been developed to date has a level of 20 dB at a frequency of 10kHz, and 80 dB at a frequency of 10 MHz to 1 GHz, and emphasis is placed on the development of an ultra-wide band EMP protection rack (level of 80 dB at a frequency of 10 kHz to 18 GHz) for protecting against a non-nuclear EMP. There is a difficulty in developing a method for manufacturing and designing an innovative protection rack according to limitations on the selection of a shield material of a constituent element for blocking an electromagnetic wave and on the manufacturing method thereof. In addition, since the shielding performance and the heat dissipation performance are mutually conflicting requirements in the EMP protection rack, it is important to manufacture the same while satisfying the two requirements and further reducing the cost and weight. In other words, it is necessary to develop an EMP protection rack that may pass air inside and outside the protection rack but block external electromagnetic waves in consideration of the operating environment of computer/communication equipment to be installed in the protection rack.

Prior Art Documents

Patent Documents (Patent Document 1) Korean Patent No. 10-1970432, Date of Registration: Apr. 12, 2019, Title: Door Opening/Closing Device of Electromagnetic Pulse Shielding Enclosure (Patent Document 2) Korean Patent No. 10-1468874, Date of Registration: Nov. 28, 2014, Title: Emergency Protection Apparatus of Server Rack

SUMMARY OF THE INVENTION

Accordingly, the present invention has been made keeping in mind the above problems occurring in the prior art, and an object of the present invention is to provide an EMP protection rack which may be implemented so as to be lightweight at low cost.

Objects of the present invention are not limited to the above-described objects, and other objects, not described here, will be clearly understood by those skilled in the art from the following descriptions.

In accordance with an aspect of the present invention to accomplish the above object, there is provided a lightweight and low-cost electromagnetic pulse (EMP) protection rack including a front door; a rear door disposed to face the front door; a left outer wall disposed between the front door and the rear door; a right outer wall disposed to face the left outer wall; a top outer wall positioned on top parts of the front door, the rear door, the left outer wall, and the right outer wall; a bottom outer wall disposed to face the top outer wall; and a main frame disposed to connect, into a single unit, the front door, the rear door, the left outer wall, the right outer wall, the top outer wall and the bottom outer wall, wherein at least one of the front door and the rear door is implemented as a roller blind having a shielding member.

In an embodiment, at least one of the front door and the rear door may be opened/closed by moving the shielding member up/down along a corresponding guide rail in the roller blind.

In an embodiment, the shielding member and the guide rail may be implemented to be in surface contact with each other.

In an embodiment, the shielding member may be formed of a single layer or multiple layers.

In an embodiment, the shielding member may include a first shielding member disposed on a first surface of a space and a second shielding member disposed on a second surface of the space.

In an embodiment, the EMP protection rack may further include a gasket configured to assemble edges of the top outer wall, the bottom outer wall, the right outer wall, or the left outer wall, which is connected to the main frame.

In an embodiment, at least one of the left outer wall and the right outer wall may be implemented as a roller blind having a shielding member.

In an embodiment, the top outer wall may be disposed with an EMP filter for a power line and a through-hole into which an optical cable is led.

In an embodiment, the roller blind may use a bracket holder so as to surface-contact the shielding member and an internal bracket.

In an embodiment, the bracket holder may be an electromagnet, and the at least one door may be implemented to bring the shielding member into surface contact between the guide rail and the bracket by turning on the electromagnet.

In an embodiment, the bracket holder may be an electric cylinder, and the at least one door may be implemented to bring the shielding member into surface contact between the guide rail and the bracket by operating the electric cylinder to push the bracket towards the guide rail.

In an embodiment, the at least one door may include a fixed frame disposed in the guide rail and connected to a main body of the main frame through at least one spring; and a bracket holder configured to bring the shielding member and the guide rail into surface contact.

In an embodiment, the roller blind may include a cylindrical support part which is wound with the shielding member in at least one of a full manual type, a semiautomatic type, and an automatic type, the shielding member may be implemented as two-layered shielding members having a space between layers thereof, the shielding member, disposed on a first surface of the space, may be in surface contact with the guide rail, and the shielding member, disposed on a second surface of the space, may be in surface contact with the fixed frame.

In an embodiment, the guide rail may be implemented in an 'E' shape to be provided with a first groove and a second groove, the shielding member may include a first shielding member and a second shielding member, and the at least one door may include a first fixed frame disposed in the first groove of the guide rail and in surface contact with the main frame; a second fixed frame disposed in the second groove of the guide rail and in surface contact with the main frame; a first bracket holder configured to bring the first shielding member and the guide rail into surface contact with each other; and a second bracket holder configured to bring the second shielding member and the guide rail into surface contact with each other.

In an embodiment, the roller blind may include a first cylindrical support part which is wound with the first shielding member in at least one of a full manual type, a semiautomatic type, and an automatic type; and a second cylindrical support part which is wound with the second shielding member in at least one of a full manual type, a semiautomatic type, and an automatic type.

In accordance with another aspect of the present invention to accomplish the above object, there is provided a lightweight and low-cost electromagnetic pulse (EMP) protection rack including a front door; a rear door disposed to face the front door; a left outer wall interposed between the front door and the rear door; a right outer wall disposed to face the left outer wall; a top outer wall positioned on top parts of the front door, the rear door, the left outer wall, and the right outer wall; a bottom outer wall disposed to face the top outer wall; and a main frame disposed to connect, into a single unit, the front door, the rear door, the left outer wall, the right outer wall, the top outer wall and the bottom outer wall, wherein each of the front door, the rear door, the left outer wall and the right outer wall is implemented as a roller blind having a shielding member.

In an embodiment, the roller blind may be implemented as a roller blind having a single structure.

In an embodiment, the roller blind may be implemented as a roller blind having a double structure.

In an embodiment, the right/left outer walls and the top/bottom outer walls may be connected to the main frame through a conductive gasket.

In an embodiment, the EMP protection rack may further include a bracket holder configured to bring the shielding member and the guide rail along which the roller blind is moved into surface contact with each other.

In an embodiment, at least one of the top outer wall and the bottom outer wall may further include a discharge fan configured to discharge internal air to an outside of the EMP protection rack.

BRIEF DESCRIPTION OF THE DRAWINGS

The accompanying drawings are provided to help the understanding of the present embodiments and the embodiments are provided together with the detailed descriptions thereof. However, the technical features of the present embodiments are not limited to specific drawings, and the features disclosed in respective drawings may be combined to configure new embodiments.

DESCRIPTION OF THE PREFERRED EMBODIMENTS

Figure 1:
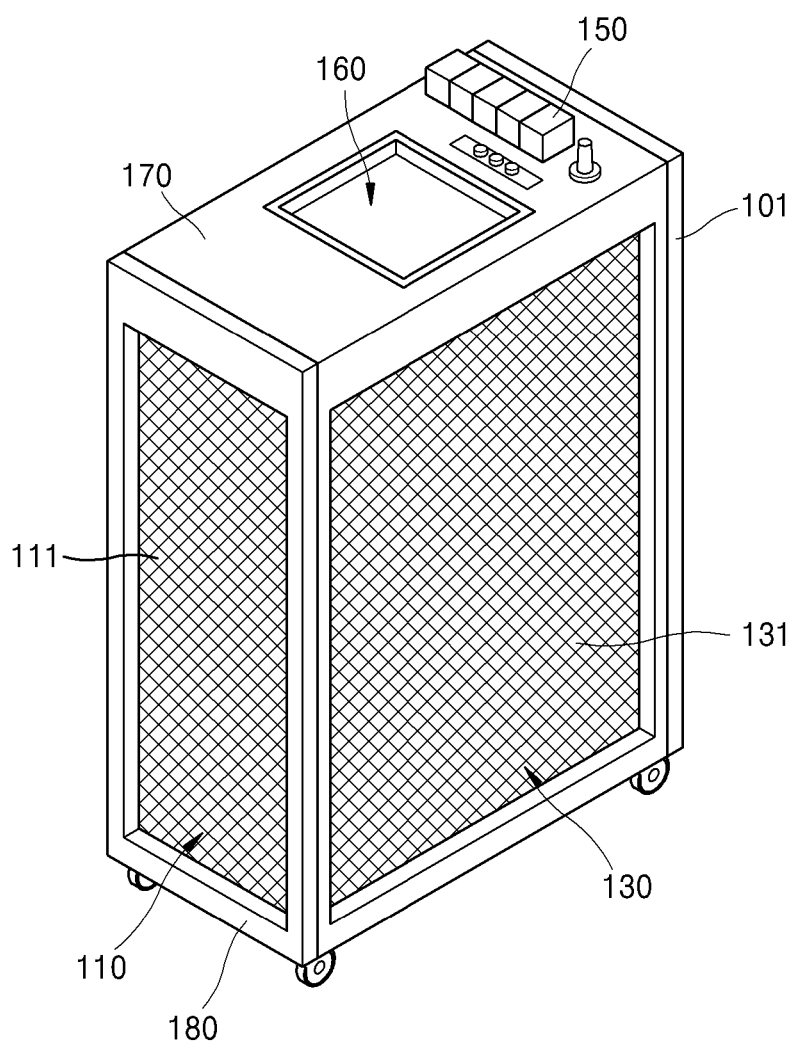
FIGS. 1 and 2 are views exemplarily illustrating an EMP protection rack according to an embodiment of the present invention.

Embodiments of the present invention are described with reference to the accompanying drawings in order to describe the present invention in detail so that those having ordinary knowledge in the technical field to which the present invention pertains can easily practice the present invention.

Reference will now be made in detail to various embodiments of the present invention, specific examples of which are illustrated in the accompanying drawings and described below, since the embodiments of the present invention can be variously modified in many different forms. However, this is not intended to limit the present invention to particular modes of practice, and it is to be appreciated that all changes, equivalents, and substitutes that do not depart from the spirit and technical scope of the present invention are encompassed in the present invention. It will be understood that, although the terms "first" and "second" may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element. It will be understood that when an element is referred to as being "coupled" or "connected" to another element, it can be directly coupled or connected to the other element, or intervening elements may be present therebetween. In contrast, it should be understood that when an element is referred to as being "directly coupled" or "directly connected" to another element, there are no intervening elements present.

The terminology used herein is for the purpose of describing particular embodiments only and is not intended to be limiting. In the present invention, the singular forms are intended to include the plural forms as well, unless the context clearly indicates otherwise. It should be further understood that the terms "comprise", "include", and "have", when used in this specification, specify the presence of stated features, integers, steps, operations, elements, components, and/or combinations thereof, but do not preclude the presence or addition of one or more other features, integers, steps, operations, elements, components, and/or combinations thereof. Unless differently defined, all terms used here including technical or scientific terms have the same meanings as terms generally understood by those skilled in the art to which the present invention pertains. Terms identical to those defined in generally used dictionaries should be interpreted as having meanings identical to contextual meanings of the related art, and are not to be interpreted as having ideal or excessively formal meanings unless they are definitely defined in the present specification.

Typically, in developing an EMP protection rack, it is important to design and manufacture a shield door, which is frequently opened and closed in operation, among constituent elements of a protection rack. Actually, the manufacturing cost of a protection rack door accounts for about 50% of the entire rack manufacturing cost. It is necessary to manufacture a shield door that is capable of satisfying all of shielding performance, convenience, durability, and economic feasibility. For the shielding performance, a structure is implemented in which the air inside/outside the protection rack may pass therethrough but external electromagnetic waves may be blocked. A shielding weak point is an inlet (e.g. a door, a vent, a through-hole). For the heat dissipation performance, a heat dissipation design is required in which the operating environment for computer and communication equipment to be installed in the protection rack is considered. It takes a long time and is expensive to complete a performance test after manufacture/assembly. For shielding of an electromagnetic wave, a conductive metal material having a thickness equal to or greater than a certain level is required. This means that the weight of a protection rack product is significant. Accordingly, it is required to develop an EMP protection rack which may replace a high-performance and high-cost commercial EMP protection rack, and which may be implemented so as to be lightweight at low cost.

For heat dissipation and cable connection, a typical rack is manufactured in a manner in which most of all faces except side surfaces are open. Such a rack is not suitable for protecting internal equipment from an external wideband electromagnetic wave. A conventional EMP protection rack provides shielding performance of 80 dB or higher. However, the high cost prevents EMP protection from proliferating. In addition, a conventional EMP protection rack is heavy, and thus difficult to install and move.

In order not to provide facility-oriented EMP protection, but to provide equipment-oriented EMP protection, the EMP protection rack according to an embodiment of the present invention may be implemented so as to be lightweight at low cost (manufacturing unit cost) so as to overcome the shortcomings of a high-cost commercial EMP protection rack.

Figure 2:
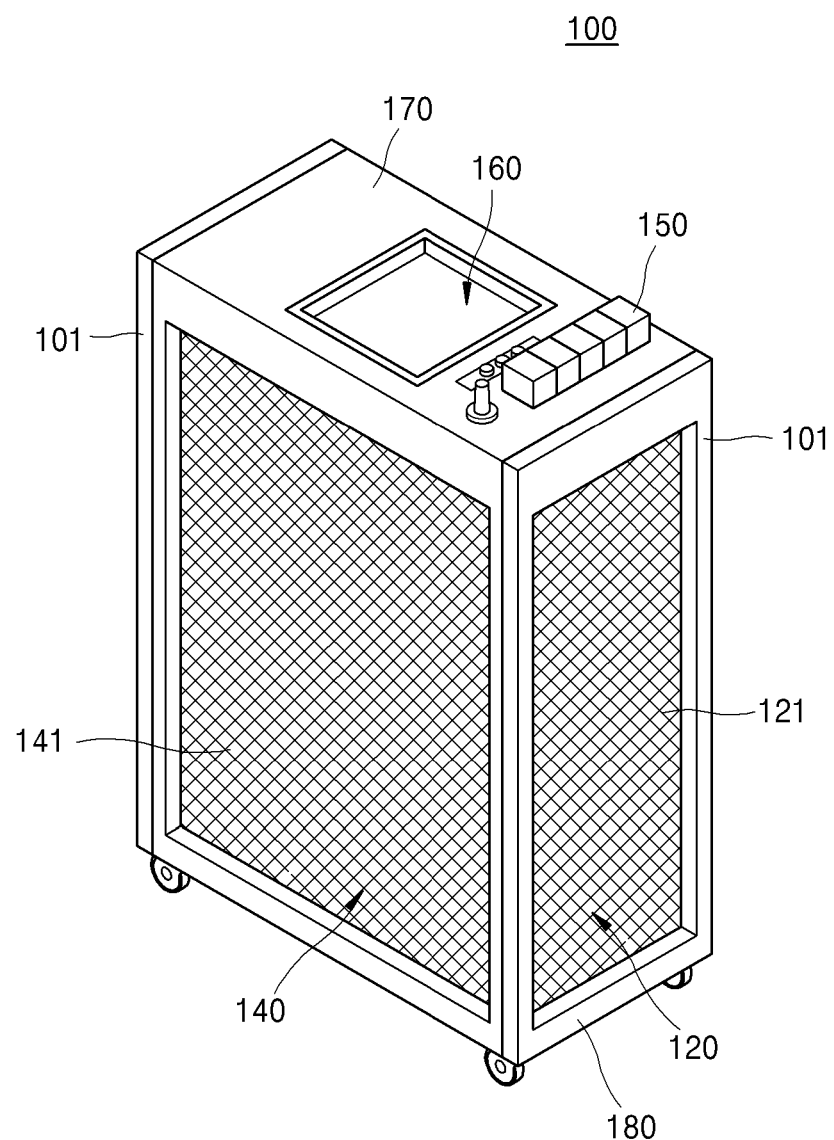

FIG. 1 and FIG. 2 are views exemplarily illustrating an EMP protection rack 100 according to an embodiment of the present invention. Referring to FIGS. 1 and 2, the EMP protection rack 100 may be implemented using a main frame 101 in a cuboid shape and shielding members 111, 121, 131, and 141 provided in the main frame 101. Here, the shielding members 111, 121, 131, and 141 enable the EMP protection rack 100 to be manufactured at low cost. The shielding members 111, 121, 131, and 141 may correspond to shield fabrics or shield films.

The main frame 101 may include a front door 110 formed of the first shielding member 111 coupled to the EMP protection rack 100 in an openable and closable manner, a rear door 120 formed of the second shielding member 121, a right outer wall 130 formed of the third shielding member 131, and a left outer wall 140 formed of the fourth shielding member 141, a power filter 150, a top outer wall 170 in which a through-hole 160 is formed, and a bottom outer wall 180.

In an embodiment, the rear door 120 may be disposed at a position that faces the front door 110. In an embodiment, the right outer wall 130 may be interposed between the front door 110 and the rear door 120. In an embodiment, the left door 140 may be disposed at a position that faces the right outer wall 130. In an embodiment, the top outer wall 170 may be disposed on top parts of the front door 110, the rear door 120, the right outer wall 130, and the left outer wall 140. In an embodiment, the bottom outer wall 180 may be disposed at a position that faces the top outer wall 170.

The main frame 101 is a framework which supports the entirety of the EMP protection rack 100, and may connect, into a single unit, the front/rear doors 110 and 120, the right/left outer walls 130 and 140, and the top/bottom outer walls 170 and 180. In an embodiment, the main frame 101 may be implemented such that surface contact, in which constituent elements are brought into contact with each other, is smoothly performed.

The front door 110 and the rear door 120 may respectively include roller blinds having corresponding shielding members 111 and 121 in a 'U'-shaped or 'E'-shaped guide rail. Such a roller blind may enable the front/rear door 110 and 120 to be opened and closed by moving upwards and downwards along the guide rail. However, it should be understood that the configurations of the front/rear doors 110 and 120 of the present invention are not limited to the roller blinds. The front/rear doors 110 and 120 of the present invention may be implemented openably and closably according to various structures using shielding members.

In an embodiment, each of the shielding members 111, 121, 131, and 141 may be formed in multiple layers depending on the shielding performance. In an embodiment, the ends of the fabrics or films may be processed so that each of the shielding members 111, 121, 131, and 141 naturally falls down due to the intrinsic weight thereof.

In an embodiment, for securing the shielding performance, each of the guide rail and the shielding members 111, 121, 131, and 141 may secure the conductivity of the roller blind through surface contact.

In an embodiment, the through-hole 160 may be implemented with a structure through which multiple optical cables are easily installed. Here, the through-hole 160 may be designed and manufactured so as to satisfy the shielding performance. In an embodiment, the through-hole 160 may be implemented in a single waveguide form so that the multiple optical cables are easily installed. In an embodiment, the through-hole 160 may be formed in the protection rack 100 by forming a tap in the main body of the through-hole 160 so as not to allow easy permeation of external electromagnetic waves.

In an embodiment, each of the top outer wall 170 and the bottom outer wall 180 may be separately implemented as a single outer wall. In an embodiment, the top outer wall 170 may be disposed with an EMP filter for a power line, so as to shield a conductive path for the power line, and the through-hole 160 through which the multiple optical cables may be led into the protection rack 100.

In an embodiment, the top outer wall 170 may include a connector panel for connecting various radio frequency (RF) signal line connectors (N, SMA, BNC).

In an embodiment, for heat dissipation, each of the insides of the top/bottom outer walls 170 and 180 may have a discharge fan mounted thereto so as to discharge the air inside the protection rack 100 to the outside thereof.

In an embodiment, honeycombs may be present in the outsides of the top/bottom outer walls 170 and 180. In an embodiment, the bottom outer wall 180 may be mounted with a ground connection terminal, wheels for movement, or the like.

In order to achieve a light weight and a low cost (manufacturing unit price), the EMP protection rack 100 according to an embodiment of the present invention may have a shield door of a roller-blind type which may simultaneously satisfy all three of shielding performance, convenience, and economic feasibility.

In the EMP protection rack 100 according to an embodiment of the present invention, contact surfaces between each roller-blind door of the shielding members 111, 121, 131, and 141 and the rack main body (guide rail) may be shielded using an electromagnet, an electric cylinder, or the like.

In the EMP protection rack 100 according to an embodiment of the present invention, in the same manner as a roller-blind manner of a typical window, the shield door may be conveniently opened or closed in a manner of folding and unfolding each of the shielding members 111, 121, 131, and 141.

Figure 3:
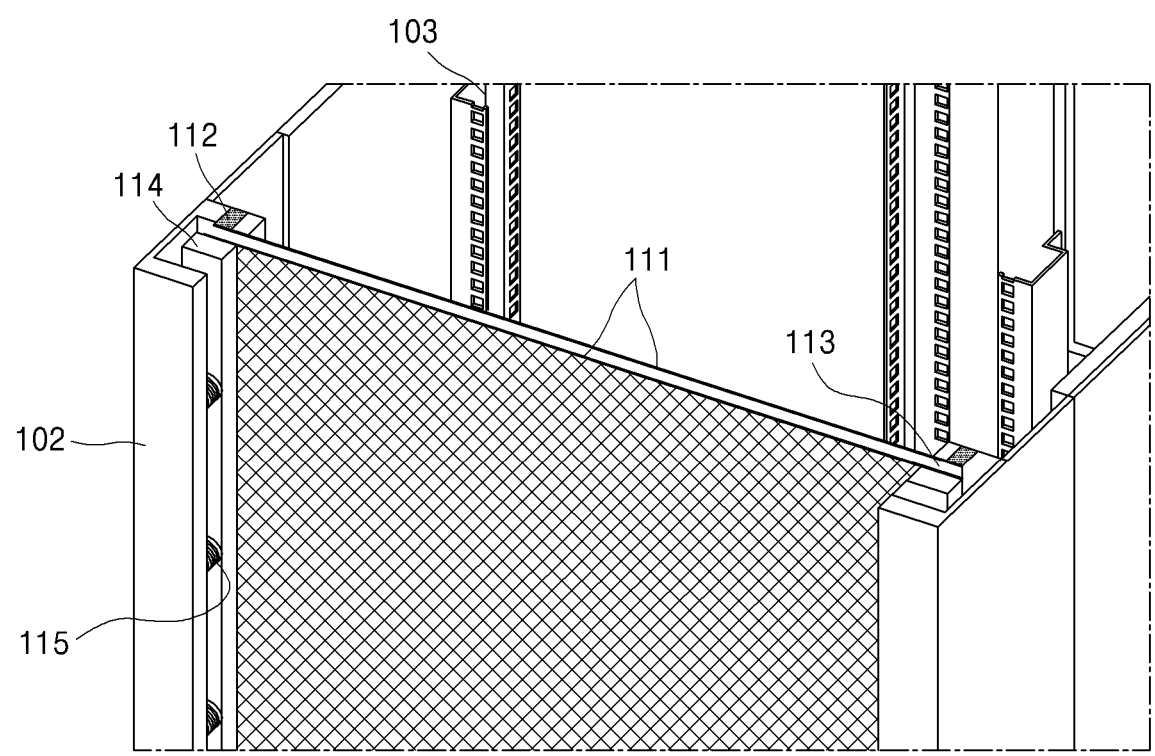
FIG. 3 is a view exemplarily illustrating a part of a front door according to an embodiment of the present invention.

FIG. 3 is a view exemplarily illustrating a part of a front door 110 according to an embodiment of the present invention. Referring to FIG. 3, a fixed frame 114 may be disposed in a groove of the 'U'-shaped guide rail 102. In an embodiment, the shielding member 111 may be moved up/down along the fixed frame 114.

In an embodiment, a bracket holder 112 may be used for surface-contacting the shielding member 111 and the guide rail 102. Here, the magnet may be a permanent magnet, an electromagnet, or an electric cylinder. In an embodiment, as illustrated in FIG. 3, the bracket holder 112 may be disposed at a top end part of the front door 110. In another embodiment, the bracket holder 112 may be used for surface-contacting the shielding member 111 and an internal bracket 103. Here, the bracket 103 is an apparatus for fixing a server (not shown) to be mounted in the protection rack 100. For convenience of explanation below, the bracket holder 112 is assumed to be an electromagnet.

In an embodiment, when shielding is desired to be performed using the front door 110 (that is, when the shield door is closed), the roller blind may be pulled down and the power of the electromagnet 112 may be turned on so that the shielding member 111 is surface-contacted between the guide rail 102 and the bracket 103.

In an embodiment, when it is desired to open the shield door of the front door 110, the power of the electromagnet 112 may be turned off. In an embodiment, the bracket (holder) 103 may be moved to the original position by springs 115.

In an embodiment, the blind of the shielding member 111 may be freely moved up and down along the guide rail 102. In an embodiment, a top edge part of the guide rail 102 may include a cylindrical support part, a bearing, a stopper, or the like, by which the shielding member 111 may be wound. Thereby, the shielding member 111 may be wound around the cylindrical support part. In an embodiment, the manner in which the shielding member 111 is wound may include a full manual type, a semiautomatic type using a spring, or an automatic type using a motor.

In an embodiment, the rear door 120 may be implemented identically to the front door 110.

Meanwhile, as the front/rear doors 110 and 120, each of the right/left outer walls 130 and 140 may be respectively implemented in a fixed type using the shielding members 131 and 141. However, it should be understood that each of the right/left outer walls 130 and 140 is not limited to this fixed type. In an embodiment, for reinforcing convenience, each of the right/left outer walls 130 and 140 may be implemented to be opened and closed in a blind manner like the front/rear doors 110 and 120.

Meanwhile, the side surfaces of a commercial computer rack may be open if necessary, but a current commercial electromagnetic wave protection rack is designed so as to have a structure in which the side surfaces are not open.

In an embodiment, the shielding member may be formed with several layers, depending on the characteristics of the material.

Figure 4:
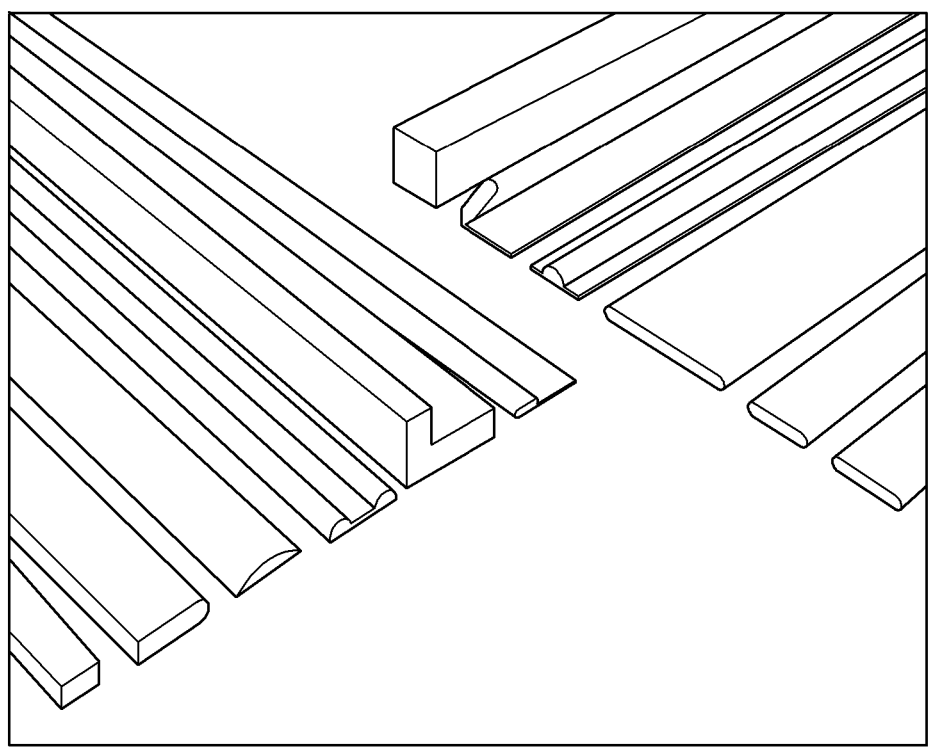
FIG. 4 is a view exemplarily illustrating a foam gasket according to an embodiment of the present invention.

FIG. 4 is a view exemplarily illustrating a foam gasket according to an embodiment of the present invention. Referring to FIG. 4, for assembling the edge parts of the top/bottom/right/left outer walls, which are connected with the main frame 101, a conductive gasket or the like may be used for maintaining the shielding performance. In an embodiment, the protective outer walls may be connected to each other with the conductive gasket interposed therebetween to thereby prevent damage to connection parts, and the entirety thereof may be connected into one conductor. Meanwhile, in order to prevent damage caused by external carelessness, a stiffener such as an acrylic plate may be added.

According to an embodiment of the present invention, a lightweight and low-cost EMP protection rack may be developed with a shield material (fabric or film). In comparison to a heavy commercial EMP protection rack, development at a weight relative thereto of 30% may be possible. A light weight may also be achieved. The convenience may be improved by manufacturing an existing heavy steel sheet with the shield material and replacing the existing shield door (combination finger and knife-edge structure) by a roller-blind structure of the shield material. The EMP protection rack 100 according to an embodiment of the present invention may be implemented with a roller-blind door through which the shielding performance is maintained and opening and closing are easily performed even with a small force. For the EMP protection rack 100 according to an embodiment of the present invention, development at a level of 20% to 30% may be possible in comparison with the commercial EMP protection rack product, which has high shielding performance but is expensive.

The EMP protection rack 100 according to an embodiment of the present invention may be implemented to provide 80 dB or higher, which is the national defense protection standard, and may address the issue of the high costs incurred for constructing an EMP facility using an EMP protection rack having shielding performance of 80 dB or higher. The EMP protection rack 100 according to an embodiment of the present invention may provide a realistic protection product in which the shielding feature of the EMP protection facility is realized so that total amount of defense standard meets 80 dB in consideration of the geographical and structural shield features of the EMP shield facility. The EMP protection rack 100 according to an embodiment of the present invention may improve the applicability of lightweight protection standard (a standard and method for evaluating the safety of a high-output and leakage electromagnetic wave) for proliferating EMP protection in the private sector.

Figure 5:
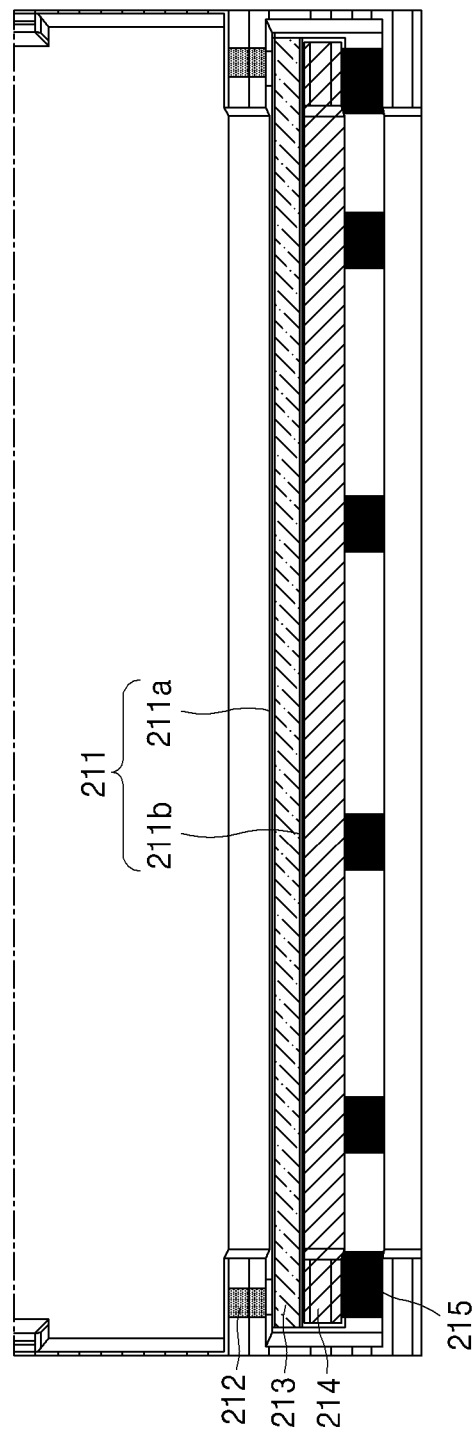
FIG. 5 is a view exemplarily illustrating a roller-blind door having a single structure according to an embodiment of the present invention.

FIG. 5 is a view exemplarily illustrating a roller-blind door having a single structure according to an embodiment of the present invention. Referring to FIG. 5, the roller-blind door having the single structure is illustrated.

In an embodiment, a fixed frame 214 may be connected to a main frame body through multiple springs 215. In an embodiment, an electromagnet 212 may enable two-layered shielding members 211 (211a and 211b) and a guide rail to surface-contact each other. A space 213 may be present between the two shielding members 211a and 211b. For example, the first shielding member 211a disposed on one surface of the space 213 may surface-contact the guide rail, and the second shielding member 211b disposed on the other surface of the space 213 may surface-contact the fixed frame 214.

In an embodiment, the roller blind may include a cylindrical support part which may be wound with the shielding member 211 in at least one of the full manual type, the semiautomatic type, and the automatic type.

Figure 6:
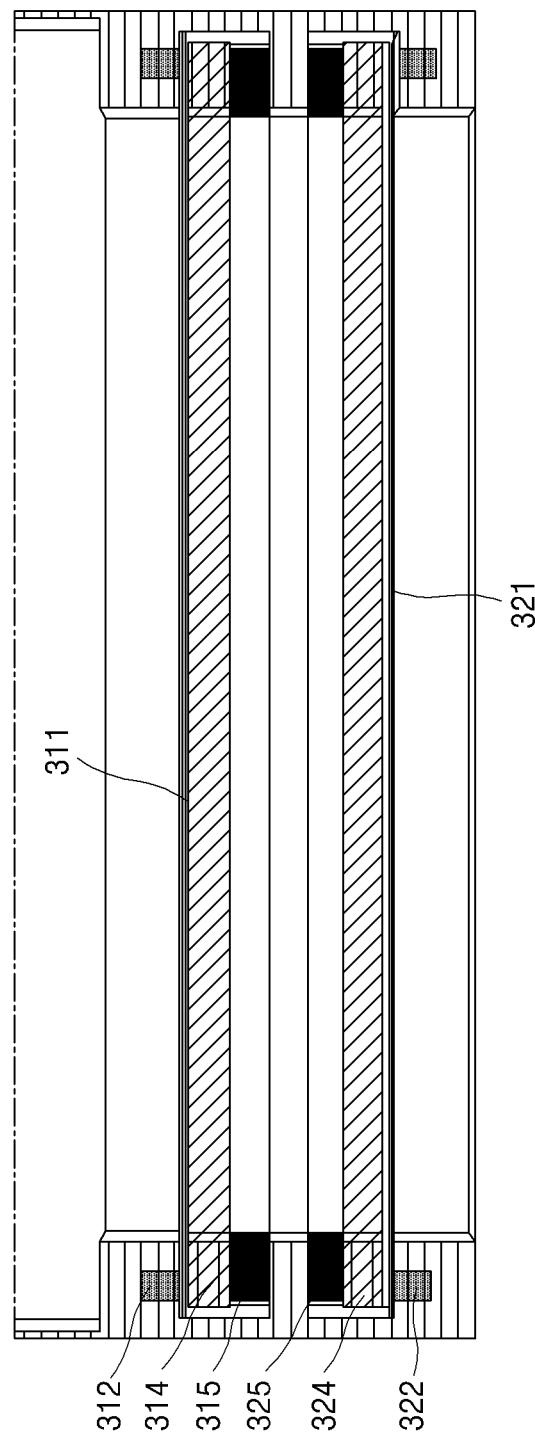
FIG. 6 is a view exemplarily illustrating a roller-blind door having a double structure according to an embodiment of the present invention.

FIG. 6 is a view exemplarily illustrating a roller-blind door having a double structure according to an embodiment of the present invention. Referring to FIG. 6, the roller-blind door having the double structure is illustrated.

One surface of the first fixed frame 314 may be brought into surface contact with a first shielding member 311. A first electromagnet 312 may bring the first shielding member 311, which contacts the first fixed frame 314, into surface contact with the guide rail. The first fixed frame 314 may be fixed to the guide rail by a first spring 315. Here, the guide rail may have an 'E' shape, and may receive a first fixed frame 314 and a second fixed frame 324. For example, the first fixed frame 314 may be disposed in a first groove formed in a top part of the guide rail, and the second fixed frame 324 may be disposed in a second groove formed in a bottom part of the guide rail.

One surface of the second fixed frame 324 may be brought into surface contact with a second shielding member 321. A second electromagnet 322 may bring the second shielding member 321, which contacts the second fixed frame 324, into surface contact with the main frame. The second fixed frame 324 may be fixed to the guide rail by a second spring 325.

In an embodiment, the roller blind may include a cylindrical support part which may be wound with the first shielding member 311 in at least one of the full manual type, the semiautomatic type, and the automatic type, and a second cylindrical support part which may be wound with the second shielding member 321 in at least one of the full manual type, the semiautomatic type, and the automatic type.

Figure 7:
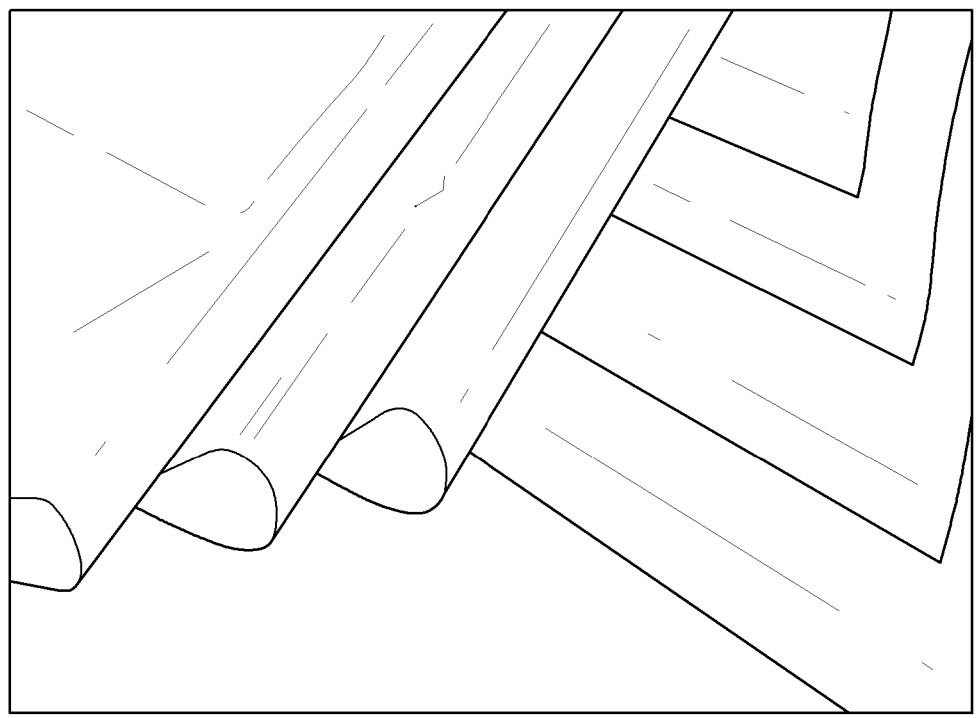
FIG. 7 is a view exemplarily illustrating a shielding member according to an embodiment of the present invention.

FIG. 7 is a view exemplarily illustrating shielding members according to an embodiment of the present invention.

In an embodiment, the specific gravity of a plate versus the specific gravity of a shielding member (fabric) is as set forth in the following table.

TABLE 1

| Type | iron | shielding member (fabric) |
|---|---|---|
| specific gravity (kgf) | 7.86 | 1.2 to 1.5 |

In an embodiment, the specific gravity of the shielding member (fabric) has a level of 15% to 20% of that of iron. However, it should be understood that the specific gravity of the shielding member is not limited thereto.

In an embodiment, by using the shielding member, the standard and method for evaluating the safety of a high-output and leakage electromagnetic wave may meet the protection standard of level 2. A cost burden, which is generated at the time of constructing an EMP protection facility using an existing commercial EMP protection rack having high performance (80 dB or higher), may be addressed. This may contribute to the active proliferation of protection racks.

The EMP protection rack according to the embodiments of the present invention may maximize convenience by opening/closing a shield door in a manner of folding and unfolding respective pieces of shielding member, which is the same manner as a roller-blind manner for a typical window. In addition, the EMP protection rack according to the embodiments of the present invention may minimize the use of and processes involving galvanized steel sheets, and thus a reduction in weight and an increase in manufacturing efficiency may be achieved.

The EMP protection rack according to the embodiments of the present invention may address a cost burden to be generated at the time of constructing EMP protection facility using an existing commercial EMP protection rack of high performance (80 dB or higher).

The EMP protection rack according to the embodiments of the present invention may maximize convenience by opening/closing a shield door in a manner of folding and unfolding each shielding member, which is the same as a roller-blind manner for a typical window.

The EMP protection rack according to the embodiments of the present invention may minimize the use of galvanized steel sheets and processes involving the same, and thus a reduction in weight and an increase in manufacturing efficiency may be achieved.

Meanwhile, the above description of the present invention merely shows detailed embodiments for practicing the present invention. The present invention may include not only a detailed means that can be actually utilized, but also a technical spirit that is an abstract and conceptual idea and that can be used as technology in the future.

What is claimed is:

1. A lightweight and low-cost electromagnetic pulse (EMP) protection rack comprising:
   a front door;
   a rear door disposed to face the front door;
   a left outer wall disposed between the front door and the rear door;
   a right outer wall disposed to face the left outer wall;
   a top outer wall positioned on top parts of the front door, the rear door, the left outer wall, and the right outer wall;
   a bottom outer wall disposed to face the top outer wall; and
   a main frame disposed to connect, into a single unit, the front door, the rear door, the left outer wall, the right outer wall, the top outer wall and the bottom outer wall,
   wherein at least one of the front door and the rear door is implemented as a roller blind having a shielding member.

2. The EMP protection rack of claim 1, wherein at least one of the front door and the rear door is opened/closed by moving the shielding member up/down along a corresponding guide rail in the roller blind.

3. The EMP protection rack of claim 2, wherein the shielding member and the guide rail are implemented to be in surface contact with each other.

4. The EMP protection rack of claim 1, wherein the shielding member is formed of a single layer or multiple layers.

5. The EMP protection rack of claim 1, wherein the shielding member includes a first shielding member disposed on a first surface of a space and a second shielding member disposed on a second surface of the space.

6. The EMP protection rack of claim 1, further comprising a gasket configured to assemble edges of the top outer wall, the bottom outer wall, the right outer wall, or the left outer wall, which is connected to the main frame.

7. The EMP protection rack of claim 1, wherein at least one of the left outer wall and the right outer wall is implemented as a roller blind having a shielding member.

8. The EMP protection rack of claim 1, wherein the top outer wall is disposed with an EMP filter for a power line and a through-hole into which an optical cable is led.

9. The EMP protection rack of claim 1, wherein the roller blind uses a bracket holder so as to surface-contact the shielding member and an internal bracket.

10. The EMP protection rack of claim 9, wherein:
the bracket holder is one of an electromagnet or an electric cylinder, and
the at least one door is implemented to bring the shielding member into surface contact between the guide rail and the bracket by turning on the bracket holder.

11. The EMP protection rack of claim 1, wherein the at least one door comprises:
a fixed frame disposed in a groove of the guide rail and connected to a main body of the main frame through at least one spring; and
a bracket holder configured to bring the shielding member and the guide rail into surface contact.

12. The EMP protection rack of claim 11, wherein:
the roller blind includes a cylindrical support part which is wound with the shielding member in at least one of a full manual type, a semiautomatic type, and an automatic type,
the shielding member is implemented as two-layered shielding members having a space between layers thereof,
the shielding member, disposed on a first surface of the space, is in surface contact with the guide rail, and
the shielding member, disposed on a second surface of the space, is in surface contact with the fixed frame.

13. The EMP protection rack of claim 1, wherein:
the guide rail is implemented in an 'E' shape to be provided with a first groove and a second groove,
the shielding member includes a first shielding member and a second shielding member, and
the at least one door includes:
a first fixed frame disposed in the first groove of the guide rail and in surface contact with the main frame;
a second fixed frame disposed in the second groove of the guide rail and in surface contact with the main frame;
a first bracket holder configured to bring the first shielding member and the guide rail into surface contact with each other; and
a second bracket holder configured to bring the second shielding member and the guide rail into surface contact with each other.

14. The EMP protection rack of claim 13, wherein the roller blind includes:
a first cylindrical support part which is wound with the first shielding member in at least one of a full manual type, a semiautomatic type, and an automatic type; and
a second cylindrical support part which is wound with the second shielding member in at least one of a full manual type, a semiautomatic type, and an automatic type.

15. A lightweight and low-cost electromagnetic pulse (EMP) protection rack comprising:
a front door;
a rear door disposed to face the front door;
a left outer wall interposed between the front door and the rear door;
a right outer wall disposed to face the left outer wall;
a top outer wall positioned on top parts of the front door, the rear door, the left outer wall, and the right outer wall;
a bottom outer wall disposed to face the top outer wall; and
a main frame disposed to connect, into a single unit, the front door, the rear door, the left outer wall, the right outer wall, the top outer wall and the bottom outer wall,
wherein each of the front door, the rear door, the left outer wall and the right outer wall is implemented as a roller blind having a shielding member.

16. The EMP protection rack of claim 15, wherein the roller blind is implemented as a roller blind having a single structure.

17. The EMP protection rack of claim 15, wherein the roller blind is implemented as a roller blind having a double structure.

18. The EMP protection rack of claim 15, wherein the right/left outer walls and the top/bottom outer walls are connected to the main frame through a conductive gasket.

19. The EMP protection rack of claim 15, further comprising a bracket holder configured to bring the shielding member and the guide rail along which the roller blind is moved into surface contact with each other.

20. The EMP protection rack of claim 15, wherein at least one of the top outer wall and the bottom outer wall further includes a discharge fan configured to discharge internal air to an outside of the EMP protection rack.

* * * * *